US012720902B2

(12) United States Patent
Ogura

(10) Patent No.: US 12,720,902 B2
(45) Date of Patent: Aug. 25, 2026

(54) IMAGING ELEMENT AND IMAGING DEVICE

(71) Applicant: NIKON CORPORATION, Tokyo (JP)

(72) Inventor: Daiki Ogura, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 18/809,689

(22) Filed: Aug. 20, 2024

(65) Prior Publication Data

US 2024/0413188 A1 Dec. 12, 2024

Related U.S. Application Data

(63) Continuation of application No. 17/764,895, filed as application No. PCT/JP2020/037287 on Sep. 30, 2020, now Pat. No. 12,094,910.

(30) Foreign Application Priority Data

Sep. 30, 2019 (JP) ................................ 2019-180783

(51) Int. Cl.
*H10F 39/00* (2025.01)
*H04N 25/78* (2023.01)
(Continued)

(52) U.S. Cl.
CPC ........... *H10F 39/811* (2025.01); *H04N 25/78* (2023.01); *H10F 39/809* (2025.01); *H10W 90/792* (2026.01)

(58) Field of Classification Search
CPC ...... H10F 39/811; H10F 39/809; H10F 39/12; H10F 39/182; H10F 39/803;
(Continued)

(56) References Cited

U.S. PATENT DOCUMENTS 7,868,283 B2 * 1/2011 Mabuchi ............... H10F 39/809 250/214 R
9,666,626 B2 * 5/2017 Kishi .................. H04N 25/767
(Continued)

FOREIGN PATENT DOCUMENTS

JP 2010093214 A * 4/2010
JP 2013-051674 A 3/2013
(Continued)

OTHER PUBLICATIONS

Jan. 28, 2025 Office Action issued in Japanese Patent Application No. 2023-189802.

(Continued)

*Primary Examiner* — Ahmed A Berhan
(74) *Attorney, Agent, or Firm* — Oliff PLC

(57) ABSTRACT

An imaging element includes a first substrate provided with a photoelectric conversion portion that photoelectrically converts light and generates charge, and a readout circuit that outputs a signal based on the charge generated by the photoelectric conversion portion, a second substrate laminated on the first substrate and provided with a processing portion that processes the signal output from the readout circuit, and a connection portion provided with a bent portion bending in a portion other than the vicinity of the first substrate and the second substrate, and electrically connecting the readout circuit to the processing portion.

22 Claims, 5 Drawing Sheets

(51) Int. Cl.
*H04N 25/79* (2023.01)
*H10W 20/40* (2026.01)
*H10W 90/00* (2026.01)

(58) Field of Classification Search
CPC .... H10F 39/8037; H04N 25/78; H04N 25/79; H04N 23/54; H01L 24/08; H01L 2224/08145; H01L 21/768; H01L 23/522
See application file for complete search history.

(56) References Cited

U.S. PATENT DOCUMENTS

| | | | | |
|---|---|---|---|---|
| 12,183,757 | B2 * | 12/2024 | Kitano | H10F 39/8037 |
| 2013/0033632 | A1 | 2/2013 | Kishi | |
| 2019/0252443 | A1 | 8/2019 | Kobayashi | |
| 2020/0035737 | A1 | 1/2020 | Ito et al. | |
| 2020/0168653 | A1 | 5/2020 | Inoue et al. | |
| 2020/0235155 | A1 | 7/2020 | Sugiyama | |

FOREIGN PATENT DOCUMENTS

| | | | | |
|---|---|---|---|---|
| JP | 2018-182038 | A | 11/2018 | |
| JP | 2019-067937 | A | 4/2019 | |
| JP | 2019-140237 | A | 8/2019 | |
| WO | 2017/126319 | A1 | 7/2017 | |
| WO | WO-2017168665 | A1 * | 10/2017 | H04N 25/79 |

OTHER PUBLICATIONS

Dec. 8, 2020 International Search Report issued in International Patent Application No. PCT/JP2020/037287.

Dec. 8, 2020 Written Opinion issued in International Patent Application No. PCT/JP2020/037287.

Apr. 11, 2023 Office Action issued in Japanese Patent Application No. 2021-551414.

Oct. 24, 2023 Office Action issued in U.S. Appl. No. 17/764,895.

May 17, 2024 Notice of Allowance issued in U.S. Appl. No. 17/764,895.

Aug. 12, 2025 Office Action issued in Japanese Patent Application No. 2023-189802.

Sep. 13, 2024 Office Action issued in Chinese Patent Application No. 202080067137.2.

Feb. 10, 2026 Office Action issued in Japanese Patent Application No. 2023-189802.

* cited by examiner 1
2
3
4
5
6
7
Y
Z
X 15
17d
17c
17b
17a
CS
16
ADC
TRN
RST
VDD
SEL
SL
TS
OU
TA
FD
TR
CC
TX
10
14
13

3a
10
11
12
13
14
20
21
22
23
24
27
28
30
31
32
33
34
35
36
36a
37
38
39
40
50
15
15e
16
17
X
Y
Z

IMAGING ELEMENT AND IMAGING DEVICE

RELATED APPLICATIONS

This application is a Continuation Application of U.S. patent application Ser. No. 17/764,895, filed Mar. 29, 2022, which is a National Stage Entry of PCT/JP2020/037287, filed Sep. 30, 2020, which claims priority to Japanese Patent Application No. 2019-180783, filed Sep. 30, 2019. The entire contents of these prior applications are incorporated by reference herein.

TECHNICAL FIELD

The present invention relates to an imaging element and an imaging device.

BACKGROUND ART

In the related art, a laminated imaging element in which a first semiconductor chip in which a pixel array is formed and a second semiconductor chip in which AD conversion portions or logic circuits are formed are laminated is known (for example, Patent Literature 1). In the imaging element of Patent Literature 1, each of the pixels in the first semiconductor chip and each of the AD conversion portions in the second semiconductor chip are connected by a conductive via. However, a degree of freedom in a layout of other wirings is limited by the conductive via.

CITATION LIST

Patent Literature

[Patent Literature 1]

Japanese Unexamined Patent Application, First Publication No. 2018-182038

SUMMARY OF INVENTION

According to a first aspect of the present invention, an imaging element includes a first substrate provided with a photoelectric conversion portion configured to photoelectrically convert light and generate charge, and a readout circuit configured to output a signal based on the charge generated by the photoelectric conversion portion; a second substrate laminated on the first substrate and provided with a processing portion configured to process the signal output from the readout circuit; and a connection portion provided with a bent portion bending in a portion other than the vicinity of the first substrate and the second substrate and configured to electrically connect the readout circuit to the processing portion.

According to a second aspect of the present invention, an imaging element includes a first substrate provided with a photoelectric conversion portion configured to photoelectrically convert light and generate charge, and a readout circuit configured to output a signal based on the charge generated by the photoelectric conversion portion; a second substrate laminated on the first substrate and provided with a control portion configured to control the readout circuit; and a connection portion including a bent portion bending in a portion other than the vicinity of the first substrate and the second substrate, and configured to electrically connect the readout circuit to the control portion.

According to a third aspect of the present invention, an imaging device includes the imaging element according to the first aspect or the second aspect; and a generation portion configured to generate image data on the basis of a signal output from the imaging element.

DESCRIPTION OF EMBODIMENTS

First Embodiment

Figure 1:
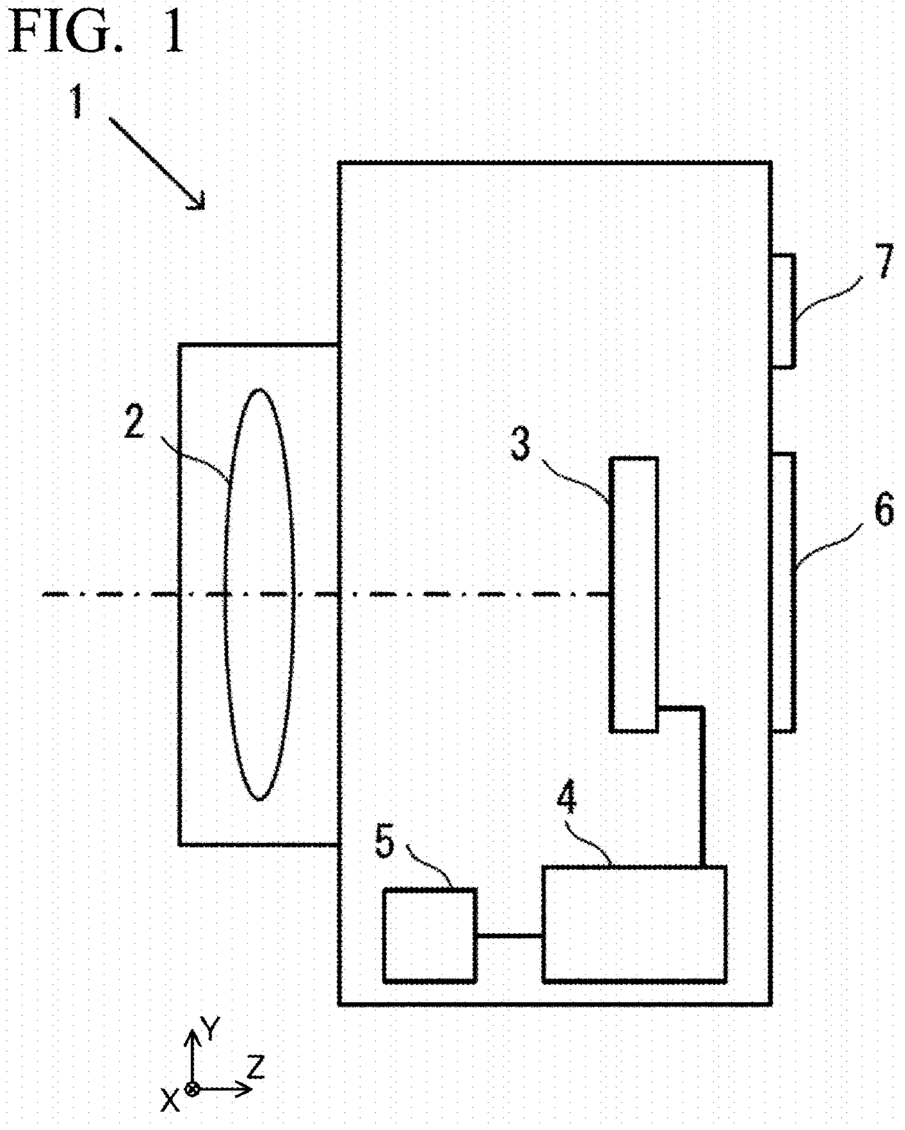
FIG. 1 is a cross-sectional view schematically illustrating a configuration of an imaging device of a first embodiment.

FIG. 1 is a diagram illustrating a configuration example of a camera 1 that is an example of an imaging device according to a first embodiment.

For an X direction, a Y direction, and a Z direction indicated by arrows in FIG. 1, a direction indicated by the arrow is a +direction. The X direction, the Y direction, and the Z direction are directions orthogonal to each other. Further, an X direction, a Y direction, and a Z direction illustrated in the following figures are also the same directions as the X direction, the Y direction, and the Z direction illustrated in FIG. 1.

The camera 1 includes a photographing optical system (imaging optical system) 2, an imaging element 3, an imaging control portion 4, a memory 5, a display portion 6, and an operation portion 7. The photographing optical system 2 includes a plurality of lenses including a focus adjustment lens (focus lens) and an aperture diaphragm, and forms a subject image on the imaging element 3. The photographing optical system 2 may be detachable from the camera 1.

The imaging element 3 is an imaging element such as a CMOS image sensor or a CCD image sensor. The imaging element 3 receives a light beam that has passed through the photographing optical system 2 and captures a subject image that is formed by the photographing optical system 2. A plurality of pixels having a photoelectric conversion portion are arranged in a two-dimensional shape (a row direction and a column direction) in the imaging element 3. The imaging element 3 photoelectrically converts the received light to generate a signal, and outputs the generated signal to the imaging control portion 4.

The memory 5 is a recording medium such as a memory card. Image data, a control program, and the like are recorded in the memory 5. Writing of data to the memory 5 and reading of data from the memory 5 are controlled by the imaging control portion 4. The display portion 6 displays an image based on image data, information on photography such as a shutter speed and an aperture value, a menu screen, and the like. The operation portion 7 includes a release button, a power switch, and various setting switches such as a switch for switching between various modes, and outputs a signal based on each of operations to the imaging control portion 4.

The imaging control portion 4 is configured of a processor such as a CPU, FPGA, or ASIC, and a memory such as a ROM or a RAM, and controls respective portions of the camera 1 on the basis of a control program. The imaging control portion 4 supplies a signal for controlling the imaging element 3 to the imaging element 3 to control an operation of the imaging element 3. The imaging control portion 4 causes the imaging element 3 to capture a subject image and output a signal, for example, when still image capturing is performed, when moving image capturing is performed, or when a through image (live view image) of the subject is displayed on the display portion 6.

The imaging control portion 4 performs various image processing on the signal output from the imaging element 3 to generate image data. The imaging control portion 4 is also a generation portion 4 that generates the image data, and generates still image data and moving image data on the basis of the signal output from the imaging element 3. The image processing includes image processing such as gradation conversion processing and color interpolation processing.

First Embodiment of Imaging Element

Next, a configuration of the imaging element 3 of a first embodiment will be described with reference to FIGS. 2 to 4.

Figure 2:
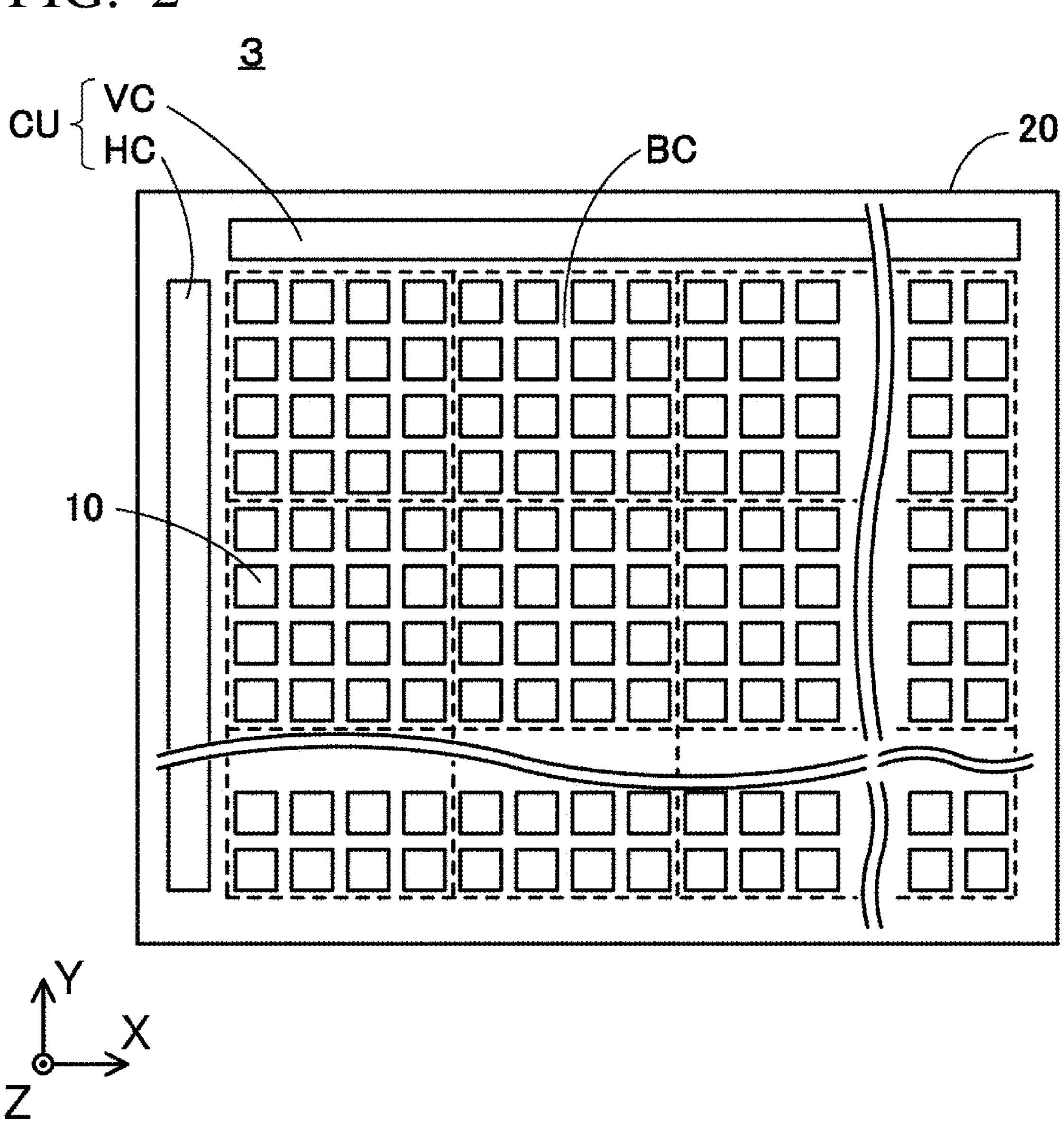
FIG. 2 is a plan view of an imaging element of the first embodiment from an imaging surface side.

FIG. 2 is a diagram of the imaging element 3 of the first embodiment from the incidence side (−Z side) of light. The imaging element 3 includes the plurality of pixels 10 arranged in the X direction (horizontal direction) and the Y direction (vertical direction). 1000 or more pixels 10 may be arranged in both the X direction and the Y direction.

A horizontal control portion HC is provided at an end portion in a −X direction in a region (a pixel region) in which the plurality of pixels 10 are arranged, and a vertical control portion VC is provided at an end portion in a +Y direction. The horizontal control portion HC and the vertical control portion VC are collectively referred to as an element control portion CU.

The plurality of pixels 10 are arranged in a so-called Bayer array, for example. Further, some of the pixels 10 may be pixels that are used for so-called image plane phase-difference type focus detection.

Figure 3:
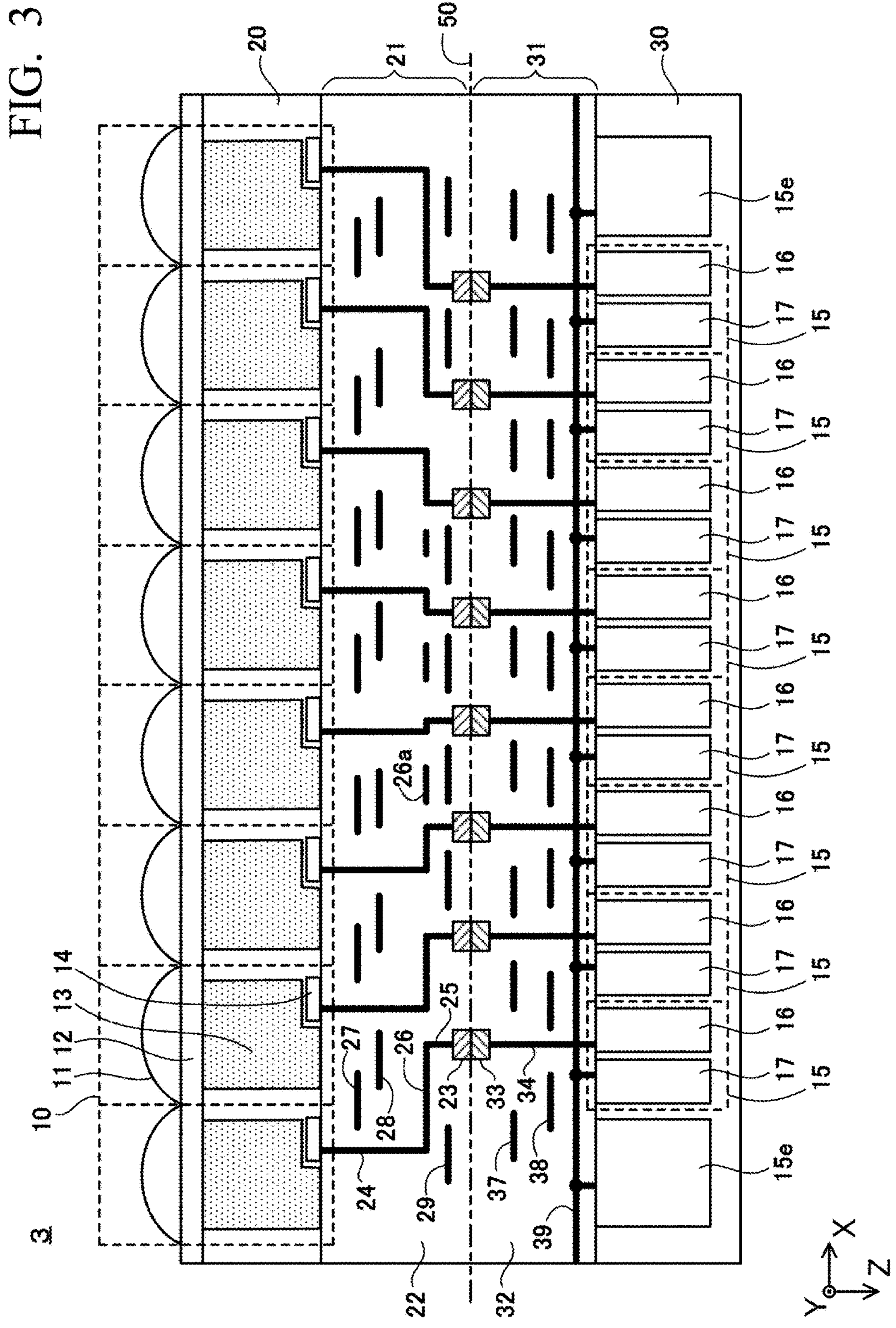
FIG. 3 is a cross-sectional view of a part of the imaging element of the first embodiment.

FIG. 3 is a diagram illustrating a cross section (XZ plane) of the pixel region of the imaging element 3. In FIG. 3, only a cross section of a part of the pixel region of the imaging element 3 is illustrated. The imaging element 3 is an imaging element in which a first substrate 20 and a second substrate 30 are laminated in a Z direction. The first substrate 20 and the second substrate 30 are made of a semiconductor such as silicon. The imaging element 3 is provided with the plurality of pixels 10 indicated by broken line frames. The pixel 10 includes a microlens 11, a color filter 12, a photoelectric conversion portion 13, and a readout circuit 14. One pixel 10 may include a plurality of photoelectric conversion portions 13 or a plurality of readout circuits 14.

The first substrate 20 is provided with the photoelectric conversion portion 13 and the readout circuit 14. The photoelectric conversion portion 13 photoelectrically converts light incident on the first substrate 20 to generate charge. The photoelectric conversion portion 13 is configured of, for example, a photodiode. The readout circuit 14 outputs a pixel signal based on the charge generated by the photoelectric conversion portion 13 to a vertical wiring, which will be described below. A configuration of the readout circuit 14 will be described below.

The microlens 11 is provided on the incidence side (in a −Z direction) of the light of the first substrate 20. The microlens 11 condenses the light incident on the first substrate 20 on the photoelectric conversion portion 13. The color filter 12 is provided between the microlens 11 and the photoelectric conversion portion 13. The color filter 12 has a spectral characteristic such that light having a specific wavelength is incident on each photoelectric conversion portion 13. The color filter 12 has spectral characteristics defined in a Bayer arrangement.

A plurality of circuit units 15 indicated by broken line frames are provided in the second substrate 30. The circuit unit 15 includes a processing portion 16 that processes a signal output from the readout circuit 14, and a control portion 17 that controls the readout circuit 14.

A first wiring layer 21 including a first insulating layer 22, a pad 23, wirings 24 to 29, and the like is provided on a surface of the first substrate 20 on the second substrate 30 side (a +Z direction). On the other hand, a second wiring layer 31 including a second insulating layer 32, a pad 33, wirings 34 to 39, and the like is provided on a surface of the second substrate 30 on the first substrate 20 side (in the −Z direction).

The wiring 24 to 29 and the wiring 34 to 39 are obtained by forming a conductor such as a metal on the first substrate 20 or the second substrate 30 using a lithography technology, similar to wirings constituting a general semiconductor integrated circuit. Therefore, the wirings 24 to 29 and the wirings 34 to 39 include wirings 26 to 29 and 37 to 39 extending substantially parallel to the XY in-plane direction parallel to the surface of the first substrate 20 or the second substrate 30 (hereinafter also referred to as "horizontal wirings"). Further, the wirings 24 to 29 and the wirings 34 to 39 include the wirings 24, 25, and 34 extending substantially parallel to the Z direction vertical to the surface of the first substrate 20 or the second substrate 30 (hereinafter also referred to as "vertical wirings").

The horizontal wirings 26 to 29 and 37 to 39 are each formed in individual wiring layers. The horizontal wirings 26 to 29 and 37 to 39 are formed by patterning, for example, a layer of a conductor such as a metal formed on the surface of the first substrate 20 or the second substrate 30 using lithography. Alternatively, the horizontal wirings 26 to 29 and 37 to 39 may be formed, for example, by forming grooves in the insulating layer formed on the surface of the first substrate 20 or the second substrate 30 using lithography and filling the grooves with a conductor such as a metal.

Further, vertical wirings 24, 25, and 34 are, for example, so-called VIA plugs formed in the vertical direction (the Z direction) in the insulating layer formed on the first substrate 20 or the second substrate 30. The vertical wirings 24, 25, and 34 may all be one VIA plug extending in the Z direction. Alternatively, the vertical wirings 24, 25, and 34 may be a plurality of VIA plugs extending in the Z direction laminated at the same position in an XY plane.

Further, the first insulating layer 22 and the second insulating layer 32 may be insulating layers formed by a plurality of insulating layers being laminated.

The wirings 24 to 29 and the wirings 34 to 39 illustrated in FIG. 3 are merely examples, and a total number thereof is not limited to the number illustrated in FIG. 3. A total number of horizontal and vertical wirings may be larger than the number illustrated in FIG. 3.

In the present embodiment, the individual wiring layers on which the horizontal wirings 26 to 29 are formed, and the first insulating layer 22 on which the vertical wirings 24 and 25 are formed are collectively referred to as the first wiring layer 21. Similarly, the individual wiring layers on which the horizontal lines 37 to 39 are formed and the second insulating layer 32 on which the vertical wiring 34 is formed are collectively referred to as the second wiring layer 31.

The first insulating layer 22 included in the first wiring layer 21 and the second insulating layer 32 included in the second wiring layer 31 are bonded (laminated) at a bonding surface (laminated surface) 50.

In each of the readout circuits 14 provided in the first substrate 20, at least one or more vertical wirings 24 are electrically connected directly or via other wirings. A lower end (an end portion in the +Z direction) of the vertical wiring 24 is connected to one end of a horizontal wiring 26 in the first wiring layer 21. The other end of the horizontal wiring 26 is connected to an upper end (end portion in the −Z direction) of a vertical wiring 25. A lower end (the end portion in the +Z direction) of the vertical wiring 25 is connected to the pad 23 that is a connection electrode.

The pad 23 and the pad 33 are connection electrodes and are bonded at the bonding surface 50. An upper end (end portion in the −Z direction) of the vertical wiring 34 is connected to the pad 33. A lower end (an end portion in the +Z direction) of the vertical wiring 34 is electrically connected to, for example, one of the processing portions 16 provided in the second substrate 30 directly or via another wiring.

The pad 23 and the pad 33 constitute a bonding portion that bonds the wirings 24 to 29 in the first wiring layer 21 formed on the first substrate 20 with the wirings 34 to 39 in the second wiring layer 31 formed in the second substrate 30.

In the present embodiment, the vertical wiring 24, the horizontal wiring 26, the vertical wiring 25, the pad 23, the pad 33, and the vertical wiring 34 are collectively referred to as a "first connection portion."

Further, the first connection portion is a wiring that connects the pixel provided in the first substrate 20 and the circuit unit 15 provided in the second substrate 30, which are separated in the Z direction (a vertical direction), and is a wiring that extends in the Z direction. Because the horizontal wiring 26 in the first connection portion extends in an in-XY plane direction (a horizontal direction) and bends with respect to the other first connection portions, the horizontal wiring 26 is also referred to as a "bent portion."

A horizontal wiring 26*a* other than a bent portion 26 (horizontal wiring 26) may be formed at the same position as a Z position at which the bent portion 26 is arranged. That is, some of a large number of horizontal wirings 26 and 26*a* in the same wiring layer may be used as the bent portions 26.

In the imaging element 3 of the first embodiment, the bent portion 26 is provided in the horizontal wirings 26 and 26*a* of a second layer in the −Z direction from the bonding surface 50 in the wiring layer 21. However, in the wiring layer 21, the bent portion 26 may be provided in the horizontal wirings 29 of a first layer in the −Z direction from the bonding surface 50. The bent portion 26 may be provided in the horizontal wiring of third or higher layers in the −Z direction from the bonding surface 50 as long as the layers are on the side close to the bonding surface 50 in the wiring layer 21.

In the above description, one of the first connection portions electrically connects one of the readout circuits 14 provided in the first substrate 20 and the processing portion 16 provided in the second substrate 30 in correspondence to the readout circuit 14. However, the first connection portion may be any of various control lines (a selection control line SEL and the like), which will be described below, that electrically connects the readout circuit 14 provided in the first substrate 20 to the control portion 17 provided in the second substrate 30 in correspondence to each readout circuit 14. As will be described below, when a plurality of control portions 17 are provided in correspondence to the respective readout circuits 14, a plurality of first connection portions may be provided according to the number of control portions 17.

A horizontal wiring 39 illustrated in FIG. 3 is, for example, a wiring for supplying a power supply voltage, a GND voltage, or a control signal to each control portion 17 provided in the second substrate 30. In FIG. 3, for example, an example in which the horizontal wiring 39 is connected to each control portion 17 is illustrated. However, a horizontal wiring that supplies a power supply voltage, a GND voltage, or a control signal to each processing portion 16 or from which an output signal from the processing portion 16 is output may be included, in addition to the horizontal wiring 39 illustrated in FIG. 3.

Figure 4:
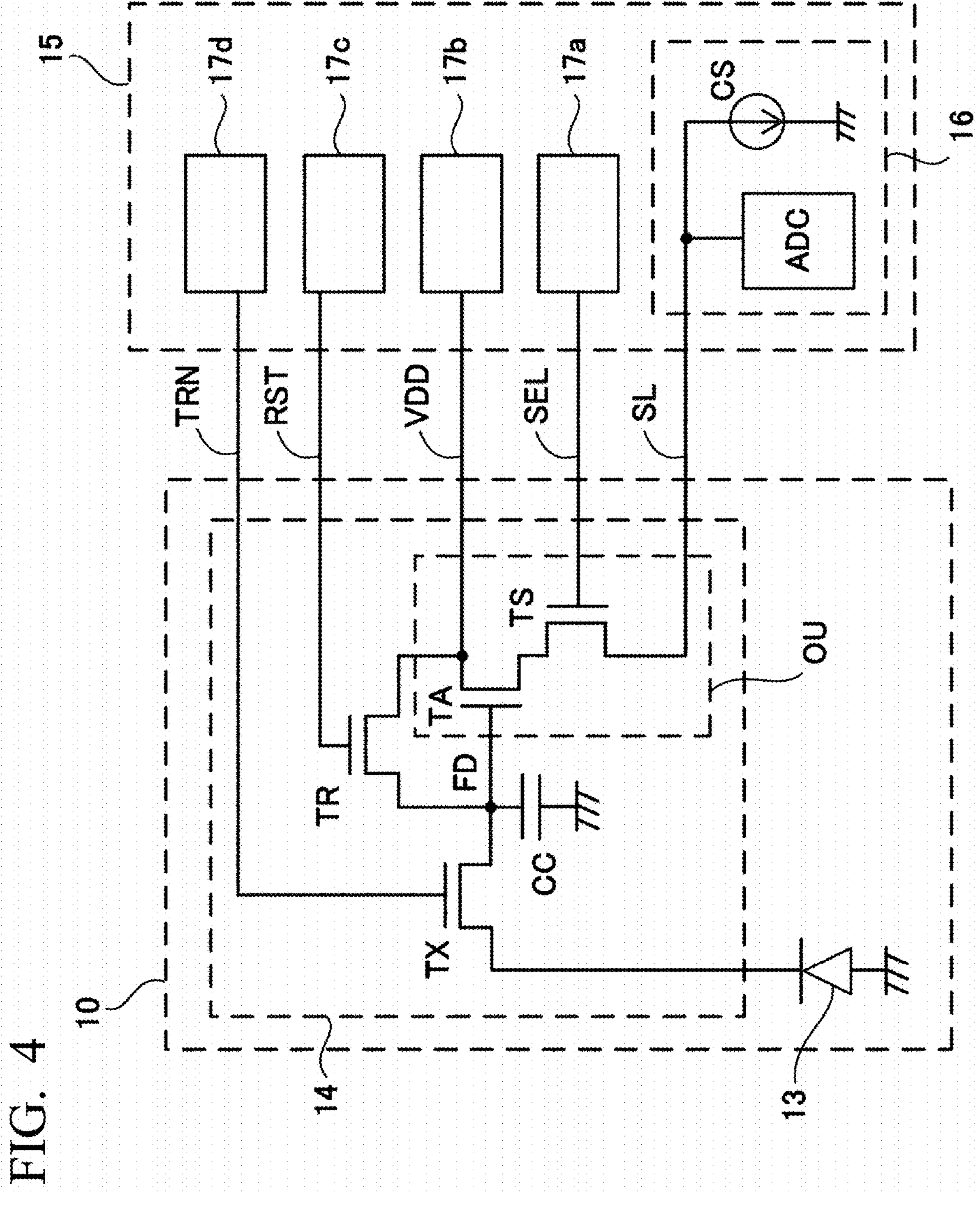
FIG. 4 is a diagram illustrating a configuration of pixels and circuit units of the imaging element of the first embodiment.

FIG. 4 is a diagram illustrating configurations of the photoelectric conversion portion 13 and the readout circuit 14 included in the pixel 10 provided in the first substrate 20, and the processing portion 16 and the control portion 17 (17*a* to 17*d*) included in the circuit unit 15 provided in the second substrate 30. Also in the imaging element 3 of the first embodiment, the pixel 10 is configured as, for example, a so-called 4-transistor type CMOS imaging pixel.

The photoelectric conversion portion 13 photoelectrically converts the light incident on the first substrate 20 to generate charge. The photoelectric conversion portion 13 is configured of, for example, a photodiode. The readout circuit 14 reads out a pixel signal based on the charge generated by the photoelectric conversion portion 13. The readout circuit 14 includes a transfer portion TX, a release portion TR, a floating diffusion (FD) FD, and an output portion OU including an amplification portion TA and a selection portion TS.

The transfer portion TX transfers the charge photoelectrically converted by the photoelectric conversion portion 13 to the floating diffusion FD. That is, the transfer portion TX is a transfer transistor TX that forms a charge transfer path between the photoelectric conversion portion 13 and the floating diffusion FD.

The charge photoelectrically converted by the photoelectric conversion portion 13 is transferred to the floating diffusion FD by the transfer portion. The floating diffusion FD accumulates the charge photoelectrically converted by the photoelectric conversion portion 13 by the transfer portion TX. That is, the floating diffusion FD is a storage portion that stores charge.

The release portion TR releases the charge accumulated in the floating diffusion FD to reset a potential of the floating diffusion to a reference potential. The release portion TR is a reset transistor TR that resets the potential of the floating diffusion to the reference potential.

The output portion OU outputs a pixel signal generated due to the charge of the floating diffusion FD to the signal line SL. The signal line SL is one line in the first connection portion (23 to 26 and 33 to 34). The signal line SL is a wiring for outputting the pixel signal to the processing portion 16. The output portion OU includes the amplification portion TA and the selection portion TS. The amplification portion TA is an amplification transistor TA that generates the pixel signal using the charge of the floating diffusion FD. The selection portion TS is a selection transistor TS that controls a connection between the pixel 10 and the signal line SL.

The selection portion TS outputs the pixel signal generated by the amplification portion TA to the signal line SL.

An analog signal (pixel signal) output from the output portion OU of the readout circuit 14 provided in the first substrate 20 passes through the signal line SL and is transferred to the processing portion 16 of the circuit unit 15 provided in the second substrate 30. The processing portion 16 includes, for example, an analog-to-digital conversion circuit ADC and a current source CS. The analog-to-digital conversion circuit ADC converts an analog signal (pixel signal) output from the selection transistor TS of the readout circuit 14 into a digital signal.

The vertical wirings 24, 25, and 34 described above include at least a part of the signal line SL for transferring the pixel signal from the pixel 10 to the readout portion ADC.

The circuit unit 15 has the plurality of control portions 17 (17*a* to 15*d*). In the present embodiment, a selection control portion 17*a*, a voltage control portion 17*b*, a reset control portion 17*c*, and a transfer control portion 17*d* are collectively or individually referred to as a "control portion 17".

The selection control portion 17*a* is electrically connected to a gate of the selection transistor TS of the readout circuit 14 via the selection control line SEL that is one line in the first connection portion (23 to 26 and 33 to 34). That is, the selection control portion 17*a* controls the selection transistor TS.

The voltage control portion 17*b* controls supply of a power supply voltage to the readout circuit 14 or the photoelectric conversion portion 13 via a power supply voltage line VDD that is one line in the first connection portion (23 to 26 and 33 to 34).

The reset control portion 17*c* is electrically connected to a gate of the reset transistor TR of the readout circuit 14 via a reset control line RST that is one line in the first connection portion (23 to 26 and 33 to 34). That is, the reset control portion 17*c* controls the reset transistor TR.

The transfer control portion 17*d* is electrically connected to a gate of the transfer transistor TX of the readout circuit 14 via a transfer control line TRN that is one line in the first connection portion (23 to 26 and 33 to 34) illustrated in FIG. 3. That is, the transfer control portion 17*d* controls the transfer transistor TX.

Hereinafter, the selection control line SEL, the reset control line RST, and the transfer control line TRN are also collectively referred to as a "control line". The control line is a wiring for sending a control signal for controlling each transistor from the control portion 17 to the readout circuit 14. Further, the control signal for controlling each transistor is transferred from the control portion 17 to at least some of the horizontal wirings 27 and 28 via the first connection portion (23 to 26 and 33 to 34).

The imaging element 3 of the first embodiment includes a plurality of processing portions 16 corresponding to the number of pixels 10. Therefore, the imaging element 3 can read out a pixel signal for each pixel 10. That is, the imaging element 3 can read out pixel signals generated by the plurality of pixels 10 at high speed and process the pixel signals. The imaging element 3 of the first embodiment includes a plurality of control portions 17 corresponding to the number of pixels 10. Therefore, the imaging element 3 can control the pixel 10 for each pixel 10. That is, the imaging element 3 can set a different exposure time for each pixel and can generate and output a pixel signal.

Depending on a configuration of the imaging element 3, a period of an arrangement in the X direction or the Y direction of the pixels 10 each including the photoelectric conversion portion 13 and the readout circuit 14 may differ from a period of arrangement in the X direction or the Y direction of the circuit units 15 each including the processing portion 16 and the control portion 17. In other words, a distance (pixel pitch) between two pixels 10 adjacent in the X direction or the Y direction may differ from a distance (circuit pitch) between the two circuit units 15 adjacent in the X direction or the Y direction. This is because it is necessary for circuits other than the circuit unit 15 to be arranged in the second substrate 30. On the other hand, this is because it is necessary to regularly arrange the pixels 10 in the first substrate 20 at equal intervals. This is, for example, because it is necessary for a control circuit 15*e* for controlling the circuit unit 15 to be arranged in each of a predetermined number of circuit units 15 arranged in the X direction or the Y direction in the second substrate 30. A circuit arranged in the second substrate 30 is not limited to the control circuit 15*e*, and may be another circuit such as a shift register or a storage portion.

Therefore, it is necessary for a width (circuit pitch) in the X direction or the Y direction of the circuit unit 15 to be made smaller than a width (pixel pitch) in the X direction or the Y direction of the pixel 10. Accordingly, the period of the arrangement in the X direction or the Y direction may of the pixels 10 may differ from the period of the arrangement in the X direction or the Y direction of the circuit units 15.

In this case, some of the plurality of circuit units 15 cannot be arranged directly under the corresponding pixel 10 (+Z direction) and are arranged at positions deviating in the X direction or the Y direction from directly under the pixel 10. In particular, some of the plurality of circuit units 15 cannot be arranged directly under the readout circuit 14 (+Z direction) of the corresponding pixels 10, and are arranged at positions deviating in the X direction or the Y direction from directly under the readout circuit 14. A problem that the corresponding circuit units 15 cannot be arranged directly under the pixels 10 is a problem that occurs because the imaging element 3 of the first embodiment has a configuration in which the circuit unit 15 is arranged in each pixel 10.

In the imaging element 3 of the first embodiment, the deviation of the positions in the X direction or the Y direction caused by a difference between the period of the arrangement of the pixels 10 and the period of the arrangement of the circuit units 15 is adjusted by using the bent portion 26 in the first connection portion (23 to 26 and 33 to 34). Accordingly, the imaging element 3 of the first embodiment solves the problem that the circuit unit 15 cannot be arranged directly under the pixel 10 caused by the difference between the period of the arrangement of the pixels 10 and the period of the arrangement of the circuit unit 15.

Specifically, the imaging element 3 of the first embodiment includes the pads 33 connected to the vertical wirings 34 extending in a directly upward direction (the −Z direction) from the respective circuit units 15, as illustrated in FIG. 3. The pad 33 is arranged substantially directly above the circuit unit 15. Therefore, the period of the arrangement in the X direction or the Y direction of the bonding portion (the pads 23 and 33) is set to match the period of the arrangement of the circuit units 15. The imaging element 3 of the first embodiment includes the bent portion 26 arranged in the first wiring layer 21 for adjusting and matching the positions in the X direction or the Y direction of the pixel 10 and the bonding portion 23. Accordingly, even when the period of the arrangement of the pixels 10 differs from the period of the arrangement of the circuit units 15 in the X direction or the Y direction, it is possible to electrically connect the pixels 10 (the readout circuits 14) to the circuit units 15 using the first connection units (23 to 26 and 33 to 34). In other words, even when the pixel pitch differs from the circuit pitch, it is possible to electrically connect the pixels 10 (the readout circuits 14) to the circuit units 15 using the first connection portions (23 to 26 and 33 to 34).

A direction (a bending direction) of the bent portion 26 may be, for example, the X direction or Y direction that is the same as a direction of the arrangement of the pixels 10.

Alternatively, the bent portion 26 may include a first portion extending in one direction in the XY plane and a first portion extending in a direction intersecting the one direction in the XY plane. That is, the bent portion 26 may include a portion that bends in the XY plane within the bent portion 26 itself.

Incidentally, for example, a large number of horizontal wirings 27 to 29 for controlling the readout circuit 14 are present in the vicinity of the first substrate 20. Further, for example, a large number of horizontal wirings 37 to 39 for controlling the processing portion 16 or the control portion 17 are present in the vicinity of the second substrate 30.

Therefore, when the bent portion 26 is formed in the vicinity of the first substrate 20, an obstacle is generated to a layout of the horizontal wirings 27 and 28 for controlling the readout circuit 14. Specifically, a degree of freedom in the wiring layout of the horizontal wirings 27 and 28 is limited by the bent portion 26. Further, a degree of integration of the horizontal wirings 27 and 28 is reduced due to the bent portion 26.

When the bent portion 26 is formed in the vicinity of the second substrate 30, a layout of the horizontal wirings 38 and 39 for controlling the processing portion 16 or the control portion 17 is impaired. Specifically, a degree of freedom in a wiring layout of the horizontal wirings 38 and 39 is limited. Further, a degree of integration of the horizontal wirings 38 and 39 is reduced due to the bent portion 26.

The horizontal wirings 26 to 29 included in the first wiring layer 21 include wirings for controlling the pixel 10, a GND line for supplying a GND voltage to the pixel 10, and a power supply line for supplying a power supply voltage to the pixel 10. The wirings for controlling the pixel 10 is, for example, wirings for controlling the transfer transistor TX, the reset transistor TR, and the selection transistor TS included in the pixel 10. Of the wirings, the wiring for controlling the transfer transistor TX or the reset transistor TR may be provided for each pixel 10 or for each pixel block including a predetermined number of pixels 10.

The wirings for controlling these transistors (hereinafter also referred to as "first control lines") are located at positions in the first wiring layer 21 close to the first substrate 20 (on the first substrate side or in the −Z direction) in order to control the transfer transistor TX, the reset transistor TR, and the selection transistor TS. That is, the horizontal wirings 27 and 28 arranged in the vicinity of the first substrate 20 include a large number of first control lines.

The GND line and the power supply line are provided in common to the plurality of pixels 10 or a plurality of pixel blocks. Therefore, the GND line and the power supply line are provided at positions (on second substrate side or in the +Z direction) in the first wiring layer 21 farther from the first substrate 20 relative to the first control line. In other words, the GND line and the power supply line are provided at positions close to the bonding surface 50. Further, a large number of first control lines are arranged in the vicinity of the pixel 10, that is, in the vicinity of the first substrate 20, as described above. Therefore, the GND line and the power supply line are provided at positions in the first wiring layer 21 farther from the first substrate 20 relative to the first control line. That is, the horizontal wiring 29 of the first wiring layer 21 arranged far from the first substrate 20 includes a large number of GND lines and power supply lines.

The horizontal lines 37 to 39 included in the second wiring layer 31 include wirings for controlling the processing portion 16 or the control portion 17, a GND line for supplying a GND voltage to the processing portion 16 or the control portion 17, and a power supply line for supplying a power supply voltage to the processing portion 16 or the control portion 17. The wirings for controlling the processing portion 16 or the control portion 17 are, for example, wirings for controlling various switching elements such as transistors included in the processing portion 16 or the control portion 17.

The wirings for controlling these transistors (hereinafter also referred to as a "second control line") are provided at positions (on the second substrate side or in the +Z direction) in the second wiring layer 31 close to the second substrate 30 in order to control the various switching elements. That is, the horizontal wirings 38 and 39 arranged in the vicinity of the second substrate 30 include a large number of second control lines.

The GND line and the power supply line are provided in common to the plurality of processing portions 16 or the plurality of control portions 17. Therefore, the GND line and the power supply line are provided at positions (on the first substrate side or in the −Z direction) in the second wiring layer 31 farther from the second substrate 30 relative to the second control line. In other words, the GND line and the power supply line are provided at positions close to the bonding surface 50. Further, as described above, a large number of second control lines are arranged in the vicinity of the processing portion 16 or the control portion 17, that is, in the vicinity of the second substrate 30. Therefore, the GND line and the power supply line are provided at positions in the second wiring layer 31 farther from the second substrate 30 relative to the second control line. That is, the horizontal line 37 of the second wiring layer 31 arranged far from the second substrate 30 includes a large number of GND lines and power supply lines.

The control line transfers a high-frequency control signal to control each transistor and each switching element. Therefore, the control line can be a noise source for the signal line SL including the bent portion 26. On the other hand, the bent portion 26 of the signal line SL can be a noise source for the control line.

In order to avoid this, the imaging element 3 of the first embodiment is provided with the bent portion 26 in a portion other than the vicinity of the first substrate 20 and the vicinity of the second substrate 30. In other words, the imaging element 3 of the first embodiment is provided with the bent portion 26 in the vicinity of the bonding surface 50. With this configuration of the imaging element 3 of the first embodiment, it is possible to wire the horizontal wirings 27, 28, 37, and 38 in an optimal layout without limiting a degree of freedom in the wiring layout of the other wirings 27, 28, 37, and 38, by using the first connection portions (23 to 26 and 33 to 34) including the bent portion 26. This makes it possible to prevent a decrease in a degree of integration of the wirings 27, 28, 37, and 38.

Further, the imaging element 3 of the first embodiment is provided with the bent portion 26 at a position away from the first control line (the horizontal wirings 27 and 28)

arranged in the vicinity of the first substrate 20 and the second control line (the horizontal wirings 38 and 39) arranged in the vicinity of the second substrate 30. In other words, the imaging element 3 of the first embodiment is provided with the bent portion 26 in the vicinity of the bonding portion. With this configuration, it is possible for the imaging element 3 of the first embodiment to curb an influence of noise from the control lines on the bent portion 26. On the other hand, it is also possible to curb an influence of noise from the bent portion 26 on the control line.

Further, the imaging element 3 of the first embodiment is provided with the bent portion 26 at a position close to the GND line and the power supply line. Because a constant voltage is basically applied to the GND line and the power supply line, an influence of noise on the signal line SL including the bent portion 26 is small. Further, it is difficult for the GND line and the power supply line to be influenced by noise from the bent portion 26 of the signal line SL. With this configuration, the imaging element 3 of the first embodiment can minimize an influence of noise on the bent portion 26. Further, the imaging element 3 of the first embodiment can minimize an influence of noise from the bent portion 26.

In the imaging element 3, the bent portion 26 may be provided at a position at some distance from the first substrate 20 and the second substrate 30 instead of being provided in the vicinity of the first substrate 20 and the vicinity of the second substrate 30.

For example, the imaging element 3 may be provided with the bent portion 26 at a distance of ¼ or more of a distance between the first substrate 20 and the second substrate 30 from the first substrate 20 and the second substrate 30. Accordingly, the degree of freedom in the wiring layout of the horizontal wirings 27 and 28 for controlling the readout circuit 14, and the horizontal wirings 37 and 38 for controlling the processing portion 16, the control portion 17, or the like is not limited. Therefore, it is possible to wire the horizontal wiring 27, 28, 37, and 38 with an optimal layout.

The imaging element 3 may be provided with at least two wiring layers (the horizontal wiring 27 and 28 or the horizontal wirings 37 and 38) between the first substrate 20 and the bent portion 26 and between the second substrate 30 and the bent portion 26. Accordingly, the degree of freedom in the wiring layout of the horizontal wirings 27 and 28 for controlling the readout circuit 14, and the horizontal wirings 37 and 38 for controlling the processing portion 16, the control portion 17, or the like is not limited. Therefore, it is possible to wire the horizontal wiring 27, 28, 37, and 38 with an optimal layout.

The first connection portion (23 to 26 and 33 to 34) of the first embodiment includes a first wiring portion (24 to 26) provided on the first wiring layer 21, a second wiring portion (34) provided in the second wiring portion 31, and the pads 23 and 33 that constitute the bonding portion that bonds the first wiring portion with the second wiring portion. The bent portion 26 is provided in the vicinity of the pads 23 and 33 that constitute the bonding portion. In other words, the bent portion 26 is provided on the side closer to the pads 23 and 33, which constitute the bonding portion, than to the first substrate 20 and the second substrate 30.

Second Embodiment of Imaging Element

Next, a configuration of an imaging element 3*a* of a second embodiment will be described with reference to FIG. 5. Most of the configuration of the imaging element 3*a* of the second embodiment is common to the configuration of the imaging element 3 of the first embodiment described above. Hereinafter, common configurations are denoted by the same reference signs, and description thereof will be appropriately omitted.

Figure 5:
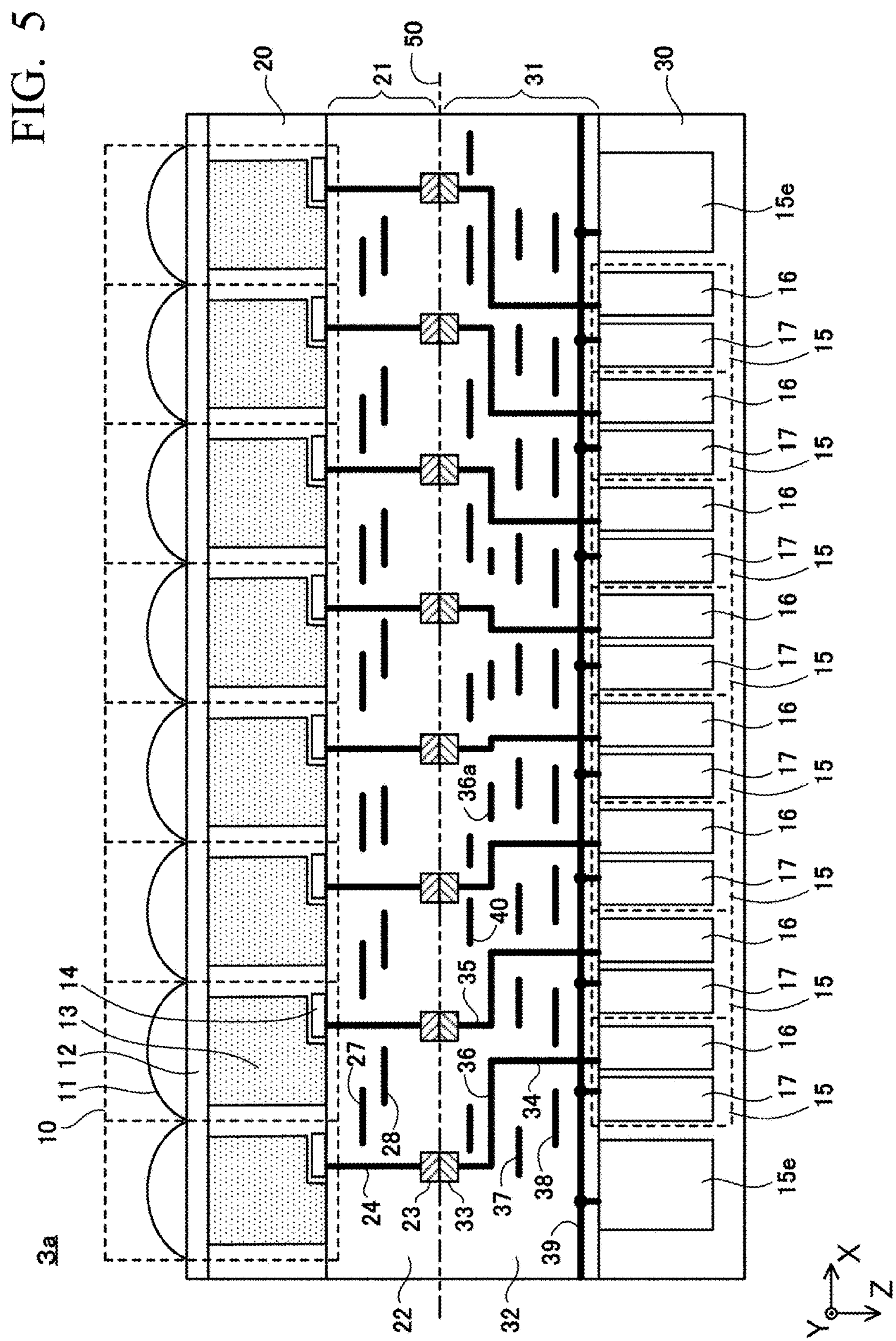
FIG. 5 is a cross-sectional view of a part of the imaging element of a second embodiment.

FIG. 5 is a diagram illustrating a cross section (an XZ plane) of a pixel 10 portion of the imaging element 3*a* of the second embodiment, and is the same diagram as in FIG. 3 described above. The imaging element 3*a* of the second embodiment differs from the imaging element 3 of the first embodiment in that an electrical connection between a readout circuit 14 and the processing portion 16 or the control portion 17 is performed by a vertical wiring 24, a pad 23, a pad 33, a vertical wiring 35, a horizontal wiring 36, and a vertical wiring 34.

In the present embodiment, the vertical wiring 24, the pad 23, the pad 33, the vertical wiring 35, the horizontal wiring 36, and the vertical wiring 34 described above are collectively referred to as a "second connection portion". Further, the first connection portion and the second connection portion described above are collectively or individually referred to as a "connection portion".

In the imaging element 3*a* of the second embodiment, the second connection portion (23 to 24 and 33 to 36) includes a first portion (24) provided in a first wiring layer 21, a second portion (34 to 36) provided in a second wiring layer 31, and pads 23 and 33 that constitute a bonding portion that bonds the first portion with the second portion.

In the imaging element 3*a* of the second embodiment, the horizontal wiring 36 that is a bent portion is arranged in the second portion closer to the second substrate 30 than to the pads 23 and 33 that constitute the bonding portion.

Specifically, the imaging element 3*a* of the second embodiment includes the pad 23 connected to the vertical wiring 24 extending in a direct downward direction (+Z direction) from the readout circuit 14 of each pixel 10, as illustrated in FIG. 5. The pad 23 is arranged substantially directly under the pixel 10 (the readout circuit 14). Therefore, a period of the arrangement in the X direction or the Y direction of the bonding portion (the pads 23 and 33) is set to match a period of the arrangement of the readout circuit 14 of the pixel 10. The imaging element 3*a* of the second embodiment includes the bent portion 26 arranged in the second wiring layer 31 for adjusting and matching the positions in the X direction or the Y direction of the bonding portion 33 and the circuit unit 15. This makes it possible to electrically connect the readout circuit 14 to the circuit unit 15 using a first connection unit (23 to 26 and 33 to 34) even when the period of the arrangement of the pixels 10 differs from the period of the arrangement of the circuit units 15 in the X direction or the Y direction. Accordingly, even when the period of the arrangement of the pixels 10 differs from the period of the arrangement in the X direction or the Y direction of the circuit units 15, it is possible to electrically connect the pixels 10 (the readout circuits 14) to the circuit units 15 by using the first connection portion (23 to 26 and 33 to 34). In other words, even when the pixel pitch differs from the circuit pitch, it is possible to electrically connect the pixels 10 (the readout circuits 14) to the circuit units 15 by using the first connection portions (23 to 26 and 33 to 34).

A period of arrangement in the X direction or the Y direction of the pixels 10 is substantially uniform in an imaging surface (an XY plane on the −Z side) of the imaging element 3*a*. Therefore, in the imaging element 3*a* of the second embodiment, the bonding portions (the pads 23 and 33) are arranged at substantially equal intervals in the X direction or the Y direction. In other words, the bonding portions (the pads 23 and 33) are arranged substantially uniformly in a bonding surface 50. Therefore, it is possible to make an electrical influence of the bonding portion on the readout circuit 14 or the circuit unit 15 substantially uniform in an in-imaging surface direction (XY direction), and to curb unevenness of noise in the imaging surface.

Also in the second embodiment, configurations or uses of the horizontal wirings 27, 28, and 37 to 39, and the like are the same as those in the first embodiment described above. Also in the second embodiment, a configuration or use of the bent portion (the horizontal wiring 36) is the same as that of the bent portion (the horizontal wiring 26) of the first embodiment described above. Also in the second embodiment, a positional relationship between the first substrate 20 and the second substrate 30, and the bent portion (the horizontal wiring 36) in the Z direction is the same as that for the bent portion (the horizontal wiring 26) of the first embodiment described above. Also in the second embodiment, a positional relationship between the horizontal wirings 27, 28, and 37 to 39 and the bent portion (the horizontal wiring 36) in the Z direction is the same as that for the bent portion (the horizontal wiring 26) of the first embodiment described above. Also in the second embodiment, a positional relationship between the pads 23 and 33, which constitute the bonding portion, and the bent portion in the Z direction is the same as that in the first embodiment described above. Further, the second embodiment is the same as the first embodiment described above in that a horizontal wiring 36*a* other than the bent portion may be formed at the same position as a Z position at which the bent portion is arranged.

Further, also in the second embodiment, an upper end of the vertical wiring 24 is electrically connected to the readout circuit 14 provided in the first substrate 20 directly or via another wiring. A lower end of the vertical wiring 34 is electrically connected to the processing portion 16 or the control portion 17 provided in the second substrate 30 directly or via another wiring.

In the imaging element 3 of the first embodiment or the imaging element 3*a* of the second embodiment, the bent portion 26 or 36 is provided in the first portion or the second portion in the vicinity of the pads 23 and 33 constituting the bonding portion. This makes it possible to reduce an influence on a layout of the wiring for controlling the readout circuit 14, the processing portion 16, the control portion 17, and the like.

Further, the bent portion 26 or 36 may be provided within ¼ of a distance between the first substrate 20 and the second substrate 30 from the pads 23 and 33 constituting the bonding portion. This makes it possible to reduce the influence on the layout of the wiring for controlling the readout circuit 14, the processing portion 16, the control portion 17, and the like.

The pads 23 and 33 refer to electrodes whose area on the XY plane is larger than areas of the vertical wirings 24, 25 and 34. However, when the first substrate 20 and the second substrate 30 can be laminated with high positional accuracy, it is not necessary to increase an area of the bonding portion. In this case, an electrode whose area in the XY plane is about the same as the areas of the vertical wirings 24, 25, 34 may be used as the bonding portion.

In the imaging element 3 or 3*a* of each of the above embodiments, the connection portion (23 to 26 and 33 to 36) that connects the processing portion 16 or the control portion 17 in the second substrate 30 to each of the photoelectric conversion portion 13 and the readout circuit 14 arranged in the first substrate 20 is provided.

However, the number of connection portions (23 to 26 and 33 to 36) may be smaller than the number of readout circuits 14. For example, in the imaging surface of the imaging element 3 illustrated in FIG. 2, one connection portion (23 to 26 and 33 to 36) may be arranged for a plurality of pixels 10 (for example, 4×4 pixels in FIG. 2) arranged in a block BC surrounded by a broken line. In other words, the one connection portion (23 to 26 and 33 to 36) is shared by the plurality of pixels 10 arranged in the block BC. Further, one circuit unit 15 may be arranged for the plurality of pixels 10 arranged in the block BC. In other words, the one circuit unit 15 is shared by the plurality of pixels 10 arranged in the block BC.

In this case, signals (pixel signals) generated by a plurality of photoelectric conversion portions 13 included in the plurality of pixels 10 in the one block BC are sequentially output to the processing portion 16 of the second substrate 30 via the one connection portion (23 to 26 and 33 to 36). Further, control signals from the control portions 17*a* to 17*d* in the second substrate 30 are also output sequentially or simultaneously to the plurality of readout circuit 14 included in the one block BC of the first substrate 20 via the one connection portion (23 to 26 and 33 to 36).

Also in the imaging element 3 or 3*a* having a configuration in which one connection portion and one circuit unit 15 (the processing portion 16 and the control portion 17) are provided for the block BC having the plurality of pixels 10, a problem that the corresponding circuit unit 15 cannot be arranged directly under each block BC arises. However, this problem is solved by providing the bent portion 26 in the wiring layer 21 in the imaging element 3 of the first embodiment as described above, and providing the bent portion 36 in the wiring layer 31 in the imaging element 3*a* of the second embodiment.

Further, also in the imaging element 3*a* of the second embodiment, a large number of control lines on which a high-frequency control signal for controlling various transistors or switching elements is transferred are arranged in the vicinity of the substrate 20 and the vicinity of the substrate 30, similar to the imaging element 3 of the first embodiment described above. Therefore, also in the imaging element 3*a* of the second embodiment, an influence of noise from the control line to the bent portion 36 and an influence of noise from the bent portion 36 to the control line are reduced by providing the bent portion 36 in a portion other than the vicinity of the first substrate 20 and the vicinity of the second substrate 30.

In the imaging element 3*a* of the second embodiment, the bent portion 36 is provided in the horizontal wirings 36 and 36*a* of a second layer in the +Z direction from the bonding surface 50 in the wiring layer 31. However, in the wiring layer 31, the bent portion 36 may be provided in a horizontal wiring 40 of a first layer in the +Z direction from the bonding surface 50. The bent portion 36 may be provided in horizontal wirings of third or higher layers in the +Z direction from the bonding surface 50 in the wiring layer 31 as long as the layers are on the side close to the bonding surface 50.

The imaging element 3 of the first embodiment and the imaging element 3*a* of the second embodiment are both so-called laminated sensors, which are formed by the first substrate 20 and the second substrate 30 being laminated. Accordingly, a large number of control lines for controlling the transistors and the like formed in the respective substrates are formed in the vicinity of the first substrate 20 and the vicinity of the second substrate 30. In order to curb an influence of noise from these control lines and secure a degree of freedom in the arrangement, provision of the bent portion 26 or 36 at the portion other than the vicinity of the first substrate 20 and the second substrate 30 is an arrangement unique to the laminated sensor. In other words, provision of the bent portion 26 or 36 in the vicinity of bonding portions (the pads 23 and 33) of the first substrate 20 and second substrate 30 is an arrangement unique to the laminated sensor.

In the imaging element 3 or 3*a* of each of the respective embodiments described above, a length of the connection portion (23 to 26 and 33 to 36) connected to each readout circuit 14 depends on a length of the bent portion 26 or 36 included therein. Therefore, an impedance of each connection portion (23 to 26 and 33 to 36) may depend on the length of the bent portion 26 or 36. When the impedance of each connection portion (23 to 26 and 33 to 36) changes, there is concern that fringe noise due to change in the impedance may occur in an image obtained from the imaging element 3 or 3*a*.

In order to avoid this fringe noise, thicknesses (line widths) of the wirings of the respective connection portions (23 to 26 and 33 to 36) may be changed on the basis of the length of the bent portion 26 or 36 so that the impedances of the respective connection portions are substantially equal to each other. Further, a conductor having a small electrical resistance may be adopted for the wiring layers used as the bent portion 26 or 36 so that a variation in the impedance of each connection portion (23 to 26 and 33 to 36) becomes small.

Alternatively, the connection portion whose bent portion 26 or 36 are shorter than those of the other connection portions may have a member that causes electrical resistance so that the impedances of the respective connection portions are substantially equal to each other.

Alternatively, in order to avoid the fringe noise, characteristic of the current source CS connected to each connection portion (23 to 26 and 33 to 36) may be changed according to the length of the bent portion 26 or 36 included in each connection portion. The characteristic of the current source CS to be changed is, for example, an amount of current to be supplied.

(1) From a first viewpoint, the imaging element 3 or 3*a* of each of the above embodiments includes the first substrate 20 provided with the photoelectric conversion portion 13 configured to photoelectrically convert light and generate charge, and the readout circuit 14 configured to output a signal based on the charge generated by the photoelectric conversion portion 13, the second substrate 30 laminated on the first substrate 20 and provided with the processing portion 16 configured to process the signal output from the readout circuit 14; and the connection portion (23 to 26 and 33 to 36) provided with the bent portion 26 or 36 bending in the portion other than the vicinity of the first substrate 20 and the second substrate 30 and configured to electrically connect the readout circuit 14 to the processing portion 16.

With such a configuration, even when the photoelectric conversion portion 13 or the readout circuit 14 and the corresponding processing portion 16 have different arrangement periods in the X direction or the Y direction, the photoelectric conversion portion 13 or the readout circuit 14 and the corresponding processing portion 16 can be electrically connected by the connection portion (23 to 26 and 33 to 36).

Further, because the bent portion 26 or 36 is arranged while avoiding the vicinity of the first substrate 20 and the second substrate 30 in which various wirings are concentrated, it is possible to arrange the bent portion 26 or 36 without adversely affecting a layout of other wirings. This makes it possible to prevent an increase in impedance in various wirings.

(2) From a second viewpoint, the imaging element 3 or 3*a* of each of the above embodiments includes the first substrate 20 provided with the photoelectric conversion portion 13 configured to photoelectrically convert light and generate charge, and the readout circuit 14 configured to output a signal based on the charge generated by the photoelectric conversion portion 13, the second substrate 30 laminated on the first substrate 20 and provided with the control portion 17 configured to control the readout circuit 14; and the connection portion (23 to 26 and 33 to 36) including a bent portion 26 or 36 bending in the portion other than the vicinity of the first substrate 20 and the second substrate 30 and configured to electrically connect the readout circuit 14 to the control portion 17.

With such a configuration, even when the photoelectric conversion portion 13 or the readout circuit 14 and the corresponding control portion 17 have different arrangement periods in the X direction or the Y direction, the photoelectric conversion portion 13 or the readout circuit 14 and the corresponding control portion 17 can be electrically connected by the connection portion (23 to 26 and 33 to 36).

Further, because the bent portion 26 or 36 is arranged while avoiding the vicinity of the first substrate 20 and the second substrate 30 in which various wirings are concentrated, it is possible to arrange the bent portion 26 or 36 without adversely affecting the layout of other wirings. This makes it possible to prevent an increase in impedance in various wirings.

(3) Further, the connection portion (23 to 26 and 33 to 36) has a configuration in which the bent portion 26 or 36 is not provided in the vicinity of the first substrate 20 and the vicinity of the second substrate 30, making it possible to further increase a degree of freedom in the layout of wirings and further curb an increase in impedances of various wirings.

(4) Further, the bent portion 26 or 36 is configured to be provided at a distance of ¼ or more of the distance between the first substrate 20 and the second substrate 30 from the first substrate 20 and the second substrate 30, making it possible to further increase a degree of freedom in the layout of wirings and further curb an increase in impedances of various wirings.

(5) Further, a plurality of wiring layers 26 to 28 and 36 to 38 provided between the first substrate 20 and the second substrate 30 are included, and the bent portion 26 or 36 is provided in the wiring layer, making it possible to reduce a manufacturing cost of the wiring layer and the bent portion.

(6) Further, at least the two wiring layers 27, 28, 37, and 38 are provided between the first substrate 20 and the bent portions 26 and 36 and between the second substrate 30 and the bent portions 26 and 36, respectively, making it possible to wire electrical circuits formed on the first substrate 20 and the second substrate 30 by using the wiring layers 27, 28, 37, and 38.

Although various embodiments and modification examples have been described above, the present invention is not limited to content thereof. Further, the respective embodiments and modification examples may be applied alone or may be used in combination. Other aspects considered within the scope of the technical idea of the present invention are also included within the scope of the present invention.

Priority is claimed on the following application, the content of which is incorporated herein by reference.

Japanese Patent Application No. 2019-180783 (filed Sep. 30, 2019)

REFERENCE SIGNS LIST

1 Imaging device
2 Imaging lens
3 Imaging element
4 Imaging control portion (generation portion)
5 Lens movement portion
BC Pixel block
HC Horizontal control portion
VC Vertical control portion
CU Element control portion
10 Pixel
20 First substrate
30 Second substrate
11 Microlens
12 Color filter
13 Photoelectric conversion unit
14 Readout circuit
15 Circuit unit
16 processing portion
17 control portion
17*a* Selection control portion
17*b* Voltage control portion
17*c* Reset control portion
17*d* Transfer control portion
21 First layer
22 First insulation layer
24 to 29 Wiring
31 Second layer
32 Second insulating layer
34 to 40 Wiring
23 and 33 Pad
50 Bonding surface
TX Transfer portion (transfer transistor)
TR Release portion (reset transistor)
TA Amplification portion (amplification transistor)
TS Selection portion (selection transistor)
FD Floating diffusion (FD)
TRN Transfer control line
RST Reset control line
VDD Power supply voltage line
SEL Selection control line
SL Output signal line
ADC Readout portion
CS Current source

The invention claimed is:

1. An imaging device comprising:

a first substrate having a pixel unit including a plurality of pixels;

a second substrate stacked together with the first substrate, the second substrate having a circuit unit including a first processing unit that performs signal processing on a first signal read from a first pixel among the plurality of pixels, and a second processing unit that performs signal processing on a second signal read from a second pixel arranged alongside the first pixel in a first direction among the plurality of pixels;

a first connection unit electrically connecting the first substrate and the second substrate, the first connection unit including a first bonding portion including first conductive members arranged so as to face each other in a second direction in which the first substrate and the second substrate are stacked, and a first signal line electrically connected to the first bonding portion and configured to output the first signal to the first processing unit; and a second connection unit electrically connecting the first substrate and the second substrate, the second connection unit including a second bonding portion including second conductive members arranged so as to face each other in the second direction, and a second signal line electrically connected to the second bonding portion and configured to output the second signal to the second processing unit, wherein:

the first signal line has a first portion extending along the second direction and a second portion extending along the first direction;

the second signal line has a third portion extending along the second direction and a fourth portion extending along the first direction; and a length of the fourth portion in the first direction is different from a length of the second portion in the first direction.

2. The imaging device according to claim 1, wherein the first conductive members include a first pad disposed on a first substrate side in the second direction and a second pad disposed on a second substrate side in the second direction, and the first signal line is electrically connected to the second pad via the first pad.

3. The imaging device according to claim 2, wherein the second portion of the first signal line is disposed closer to the first pad than to the first substrate in the second direction.

4. The imaging device according to claim 2, wherein the second conductive members include a third pad disposed on the first substrate side in the second direction and a fourth pad disposed on the second substrate side in the second direction, and the second signal line is electrically connected to the fourth pad via the third pad.

5. The imaging device according to claim 4, wherein the second portion of the first signal line is disposed closer to the first pad than to the first substrate in the second direction, and the fourth portion of the second signal line is disposed closer to the third pad than to the first substrate in the second direction.

6. The imaging device according to claim 1, wherein the first conductive members include a first pad disposed on a first substrate side in the second direction and a second pad disposed on a second substrate side in the second direction, and the first signal line electrically connects between the second pad and the first processing unit.

7. The imaging device according to claim 6, wherein the second portion of the first signal line is disposed at a position closer to the second pad than to the second substrate in the second direction.

8. The imaging device according to claim 6, wherein the second conductive members include a third pad disposed on the first substrate side in the second direction and a fourth pad disposed on the second substrate side in the second direction, and the second signal line electrically connects between the fourth pad and the second processing unit.

9. The imaging device according to claim 8, wherein the second portion of the first signal line is disposed at a position closer to the second pad than to the second substrate in the second direction, and the fourth portion of the second signal line is disposed at a position closer to the fourth pad than to the second substrate in the second direction.

10. The imaging device according to claim 1, wherein the first processing unit includes a first conversion unit configured to convert the first signal into a digital signal, and the second processing unit includes a second conversion unit configured to convert the second signal into a digital signal.

11. The imaging device according to claim 1, wherein the second pixel is arranged alongside the first pixel in a row direction.

12. The imaging device according to claim 11, wherein the second pixel is arranged adjacent to the first pixel in the row direction.

13. The imaging device according to claim 1, wherein the second pixel is arranged alongside the first pixel in a column direction.

14. The imaging device according to claim 13, wherein the second pixel is arranged adjacent to the first pixel in the column direction.

15. The imaging device according to claim 1, wherein the circuit unit further includes a third processing unit that performs signal processing on a third signal read from a third pixel arranged alongside the first pixel in the first direction.

16. The imaging device according to claim 15, further comprising a third connection unit including a third bonding portion including third conductive members arranged to face each other in the second direction, and a third signal line configured to output the third signal to the third processing unit, wherein:

the third signal line has a fifth portion extending along the second direction and a sixth portion extending along the first direction;

a length of the sixth portion in the first direction is different from the length of the second portion; and the length of the sixth portion is also different from the length of the fourth portion.

17. The imaging device according to claim 15, wherein the third processing unit includes a third conversion unit configured to convert the third signal into a digital signal.

18. An imaging apparatus comprising the imaging device according to claim 1.

19. The imaging apparatus according to claim 18, further comprising a mounting unit to which an optical system configured to emit light to the imaging device is attached.

20. The imaging apparatus according to claim 19, further comprising the optical system.

21. The imaging apparatus according to claim 18, further comprising an imaging control unit configured to control driving of the imaging device.

22. The imaging apparatus according to claim 21, wherein the imaging control unit performs image processing on a signal output from the imaging device.

* * * * *